United States Patent [19]
Colyn

[11] 3,963,945
[45] June 15, 1976

[54] DEVICE FOR PRODUCING ELECTRICAL PULSES

[75] Inventor: Roland Colyn, Le Perreux-sur-Marne, France

[73] Assignee: Compagnie Generale d'Electricite, Paris, France

[22] Filed: Mar. 13, 1976

[21] Appl. No.: 558,100

[30] Foreign Application Priority Data
Mar. 14, 1974 France .................. 74.08745

[52] U.S. Cl. ............... 307/268; 307/252 K; 315/207; 315/241 R; 315/243; 323/25; 328/67
[51] Int. Cl.² ................ H01S 3/09; H03K 3/57
[58] Field of Search ......... 307/252 J, 252 K, 252 L, 307/268; 315/206, 207, 240, 241 R, 243, 306, 307; 321/18; 323/8, 22 SC, 23, 25; 328/67, 71, 78

[56] References Cited
UNITED STATES PATENTS
3,749,976   7/1973   Colyn .................. 323/25 X

*Primary Examiner*—A. D. Pellinen
*Attorney, Agent, or Firm*—Sughrue, Rothwell, Mion, Zinn & Macpeak

[57] ABSTRACT

Device for producing electrical pulses, comprising a charge circuit for a capacitor and a discharge circuit, characterized in that it comprises circuitry for storing the charge power brought into play when the voltage at the terminals of the capacitor has reached a given value and circuitry for restoring that power to the capacitor after its discharge.

1 Claim, 2 Drawing Figures

DEVICE FOR PRODUCING ELECTRICAL PULSES

The present invention relates to a device for producing electrical pulses intended more particularly for feeding an arc lamp used for triggering the light pulses of a laser.

A pulse generator comprising, as described in FIG. 1, a capacitor C forming a part of a charge circuit and of a discharge circuit, is known.

The charge circuit comprises, moreover, a capacitor C1, an inductance L1 and a thyristor T1 and is fed by a controllable rectifier bridge, connected to a three-phased network U and comprising diodes Da, Db, Dc and thyristor Ta, Tb and Tc.

The bridge is connected to the charge circuit by means of an inductance La. The discharge circuit comprises an inductance L2, a thyristor T2 and a load R, such as an arc lamp or a flash tube.

The elements of the charge circuit are chosen so that they be resonant for the charge of the capacitor C by L1 and those of the discharge circuit are chosen so that they be almost at the critical damping.

The operation of that device is as follows:

Originally, the voltage is zero on C; the thyristor T1 is fired; the current I1 in the charge circuit follows a sinusoidal law and ceases at the pass through zero by unpriming of the thyristor T1. The charge voltage of C then reaches twice the voltage of C1, assuming that losses are zero. When the thyristor T2 is fired, the capacitor C discharges into the load through the discharge circuit. According to the value of L2 and that of the resistor of the load, the discharge will be damped or aperiodic.

The circuitry which has just been described would be acceptable if the voltage at the terminals of the capacitor C1 were sufficiently stable; now, that stability entails, on the one hand, a high value of the capacity of the capacitor C1 and, on the other hand, a proper regulating of the output voltage of the rectifier circuit with a response time which is short in respect to the fluctuations of the voltage of the supply mains.

One aim of the present invention is to improve the device which has just been described in order to obviate the restriction imposed by the stabilizing of the rectifier.

Moreover, if a three-phase 50 c/s mains is used, the fundamental undulation is 300 c/s, that is, a period of 3.3 milliseconds. If a pulse train production of 800 c/s (that is, a pulse period of 1.25 milliseconds) is required, it must be possible to charge the capacitor C twice during a charge period of the capacitor C1. Another aim of the invention is to improve the known system in order to enable that double charge of C.

The invention has, as its object, a device for producing electrical pulses in a load element, that device comprising a first capacitor, a charge circuit for that first capacitor comprising an alternating current voltage source rectified by a bridge, a second capacitor, connected up between the outputs of that bridge and a first inductance connected up between an output of that bridge and a plate of the first capacitor and a circuit for the discharge of that first capacitor into the said load element, characterized in that it comprises means for stopping the charge of the first capacitor when the voltage at its terminals reaches a predetermined value and for storing the power supplied previously by the said charge circuit and means for transferring into the said first capacitor that stored power after that first capacitor has discharged into the said load element.

The invention will be well understood from the description of an embodiment of the invention, with reference to the accompanying drawing, in which.

Figure 1:
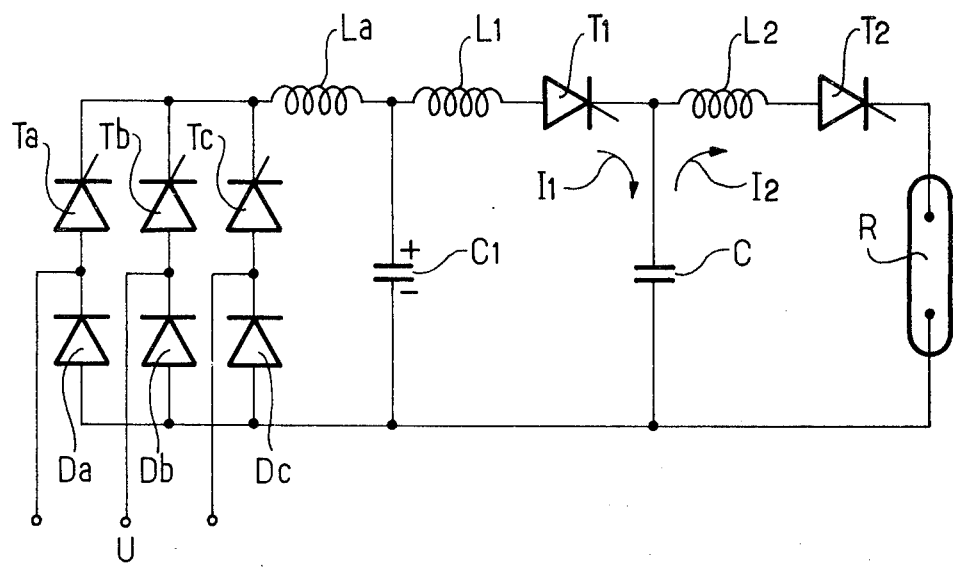
FIG. 1 is a diagram of a device for producing electrical pulses according to the known art.

The preamble describes the operation of the circuit in FIG. 1.

Figure 2:
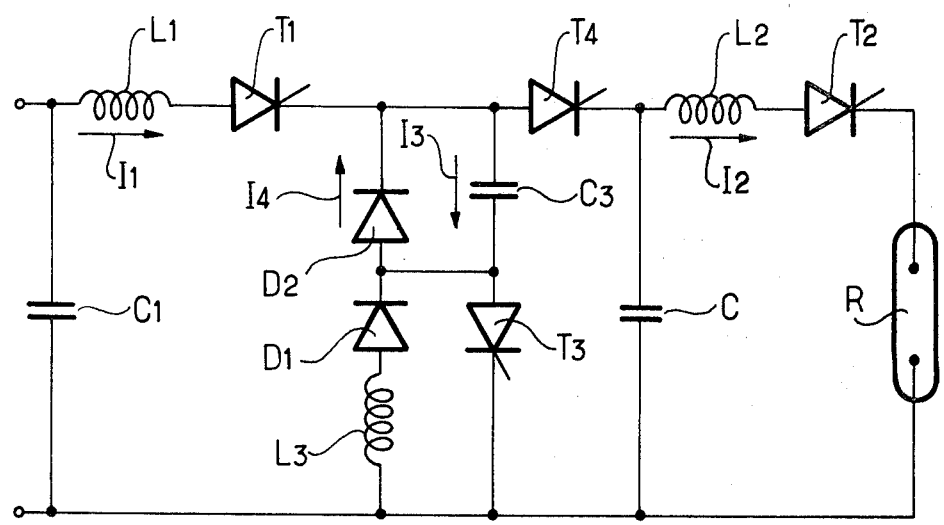
FIG. 2 is a diagram of a device for producing electrical pulses, comprising the improvements according to the invention.

FIG. 2 shows the circuit in FIG. 1, in which the annex circuits which are the object of the invention have been illustrated. The rectifier, for which it is necessary to refer to FIG. 1, has not been shown.

These circuits comprise a first branch formed by a capacitor C3 in series with a thyristor T3, a second branch formed by two diodes D1 and D2 each in series with a third inductance L3. The point common to the diodes D1 and D2 is connected to the point common to the third thyristor T3 and to the third capacitor C3.

A fourth thyristor T4 is placed in series in the charge circuit of the capacitor C, downstream from the above-mentioned branches.

The operation of the device is as follows:

Let it be assumed that the capacitor C is being charged by the current I1. The thyristors T1 and T4 are therefore conductive; the charge of the capacitor C3 is assumed to be zero. When the voltage at the terminals of the capacitor C has reached the required value, the thyristor T3 is fired (the means for measuring the voltage at the terminals of the capacitor C and the means for priming the thyristor T3 have not been shown).

The current I1 of the charge circuit is shunted in the capacitor C3 and the thyristor T3; the current which flows in the direction of the arrow shown in FIG. 2 has been represented as I3. The capacitor C3 is charged by that current. When the current I1 (shunted to I3) is cancelled, the thyristors T1 and T3 are extinguished. The anode of the thyristor T4 having been brought to a zero voltage, the thyristor T4 is also extinguished. Thus, the excess power of the charge circuit is stored in the capacitor C3 and the circuit formed by the capacitor C3 and by the diode D2 is isolated from the thyristors T1 and T4.

It is possible to obtain a first pulse in the load R by firing the thyristor T2.

The circuit upstream from the capacitor C remains in its state until a firing signal for the thyristor T4 is given. That signal (provided by a circuit which is not shown) controls the transfer into the capacitor C of the power stored in the capacitor C3.

Indeed, when the thyristor T4 is fired, a current I3 (in the reverse direction to the arrow) is set up and charges the capacitor C, closing with the inductance L3 and the diode D1.

The voltage at the terminals of the capacitor C3 decreases, is cancelled when the current I3 reaches its maximum, but cannot reverse because of the presence of the diode D2. The current which continues to flow in the inductance L3 and the diode D1 then passes into the diode D2 (this is the current I4 in FIG. 2). That current decreases from the maximum value of I3 until the value of zero through the thyristor T4 and the capacitor C, this meaning that the power of the inductance L3 will, just like that of the capacitor C3, be transferred into the capacitor C.

If the thyristors T1 and T4 are fired, a current I1 is set up in the charge circuit and this brings the system to the beginning of a new cycle.

By way of an example, if the load R has a resistance of 3.3 ohms, for a pulse having a power of 4 Joules at 500 volts, the capacitor C must have a value of 32 microfarads.

If the discharge circuit is at the critical damping, consequently, the inductance L2 must have a value of approximately 90 microhenrys.

To determine the value of the inductance L1, it should be simply observed that the period $t1$ of the charge current I1 should come within the limits of the available period of a 800 c/s cycle, that is, 1250 microseconds, with a discharge period of 150 microseconds.

If $t1$ is taken as 300 microseconds, consequently, the inductance L1 must have a value of 400 microhenrys (conventional resonance conditions of the discharge circuit).

Lastly, calculations show that the capacitor C must admit an effective current close to 100 amperes.

I claim:

1. A device for producing electrical pulses in a load element connected to the device, and comprising:
   a first capacitor;
   a charging circuit for the first capacitor and comprising an alternating current voltage source rectified by a bridge, a second capacitor the plates of which are connected respectively to the outputs of the bridge, the plates of the second capacitor also being connected respectively to the plates of the first capacitor;
   a first branch connected in parallel with said first capacitor between said first and second capacitors, the first branch comprising, in series, a third capacitor and a first thyristor, said first thyristor allowing a current to pass through said third capacitor when the thyristor is on;
   a second branch connected in parallel with said first capacitor between said first and second capacitors, the second branch comprising in series a first inductance, a first diode, and a second diode, the first diode and the first inductance being in parallel with the first thyristor, said first diode allowing a current to pass in said third capacitor when said first thyristor is off, that current flowing in the opposite direction to that which crosses said third capacitor when said first thyristor is on, said first and second diodes being poled in the same direction in said second branch;
   a second inductance and a second thyristor connected in series in the charging circuit between said second capacitor and said branches, the second thyristor allowing the charging current to pass when the thyristor is on; and
   a third thyristor connected in series in the charging circuit between said branches and said first capacitor, the third thyristor allowing the charging current to pass when the thyristor is on;
   whereby, the selective turning on and off of said first, second and third thyristors repetetively stores energy in said third capacitor and transfers it to said first capacitor for subsequent discharge into said load element as the electrical pulses.

\* \* \* \* \*